United States Patent [19]
Cavanagh et al.

[11] 3,947,770
[45] Mar. 30, 1976

[54] BROADBAND OMNIDIRECTIONAL RF FIELD INTENSITY INDICATING DEVICE

[75] Inventors: John F. Cavanagh; Dennis E. Vaught; Hugh K. Wolfe, all of Dahlgren, Va.

[73] Assignee: The United States of America as represented by the Secretary of the Navy, Washington, D.C.

[22] Filed: July 12, 1974

[21] Appl. No.: 487,940

[52] U.S. Cl. .............................................. 325/363
[51] Int. Cl.² ........................................ H04B 17/00
[58] Field of Search .................... 325/363, 364, 366; 343/100 ME, 855, 867, 841, 842

[56] References Cited
UNITED STATES PATENTS

| | | | |
|---|---|---|---|
| 2,690,509 | 9/1954 | Toth | 343/855 |
| 3,296,533 | 1/1967 | Karpinsky | 325/363 |
| 3,783,448 | 1/1974 | Brodwin | 325/363 X |

FOREIGN PATENTS OR APPLICATIONS

| | | | |
|---|---|---|---|
| 419,783 | 11/1934 | United Kingdom | 343/842 |

Primary Examiner—George H. Libman
Assistant Examiner—Robert Hearn

[57] ABSTRACT

A device for indicating the intensity of the vertical component of an incident electromagnetic field independently of the frequency or the direction of the field uses a dual-loop antenna, current transformers and a means for combining voltage signals. The two antenna loops are planar and the planes of the loops are disposed orthogonally to each other. The loops are arranged to intersect at a common central axis, and the loops are thus symmetrically disposed about the axis. When a source of electromagnetic radiation is incident on the antenna, a current is generated in the loops which is then transformed into a voltage and combined to produce an output which is independent of frequency, of the direction of the field, and is thus representative of the total vertical field intensity.

2 Claims, 5 Drawing Figures

BROADBAND OMNIDIRECTIONAL RF FIELD INTENSITY INDICATING DEVICE

BACKGROUND OF THE INVENTION

This invention relates to a device for omnidirectionally measuring the intensity of a vertical electromagnetic field independently of frequency in a given range, using an antenna to sense the incident field.

Modern ordnance systems often employ sensitive, electrically-initiated explosive elements, known as electroexplosive devices (EED's) to activate control and arming devices and to initiate explosive trains. The proliferation of EED's has raised the concern of their accidental detonation by powerful radar and communications equipment. The frequency range of greatest concern is 2MHz to 32MHz, since it is in this range that the smallest electromagnetic field intensity can cause accidental EED detonation.

Consequently, it is of great importance to be able to measure, in the 2MHz to 32MHz range, small (less than 0.2 volts/meter) vertical electric field intensities in which the measurement is omnidirectional, independent of frequency, and in standard vertical electromagnetic field intensity units of general application. Any field intensity indicating device for the protection of EED's must also be able to sum the total resultant field when several electromagnetic sources are radiating from a variety of directions in the vicinity of the EED. Additionally, such a meter should be compact, simple, not subject to drift, nor sensitive to the presence of personnel.

None of the electromagnetic-field intensity measuring devices heretofore known have had this capability. The previously used method of measuring electromagnetic field intensity in the 2MHz to 32MHz range used a tunable narrow-bandwith device. If several sources were radiating, a separate measurement for each frequency transmitted would be required, and then each of the readings at each frequency had to be converted to field strength, and then the square root of the sum of the squares would have to be taken to complete the total vertical electromagnetic field strength measurement. This meter was also bulky, complicated and subject to drift and to the presence of personnel.

Another device, described in U.S. Pat. No. 3,063,010, uses a symmetrical antenna to monitor the thermogenic action of R.F. energy and its potential effects on the human body. This device does not measure electromagnetic field intensity in standard vertical electric field intensity units, however, and thus would be useless to warn against the potential hazards of electromagnetic field strength to EED's.

Another device is described in U.S. Pat. No. 3,130,368 which uses a spiral antenna to monitor electromagnetic radiation omnidirectionally and independently of frequency within a fixed frequency range. The frequency range in which this device operates is from 200MHz to 10GHz. This frequency range is far above the 2MHz to 32MHz range in which the greatest hazards to accidental EED detonation occur. The device of this patent would be ineffective as a warning device against accidental EED detonation in this lower frequency range.

SUMMARY OF THE INVENTION

Briefly, the device of the invention comprises; (1) a two-loop antenna which generates a current in response to the vertical component of the strength of an incident electromagnetic field, omnidirectionally and independently of the frequency, within a given range, of the incident field; (2) a current transformer connected to each of the antenna loops, which generates a voltage signal proportional to the current generated in each loop of the antenna; (3) means for combining the voltage signals to provide an output signal independent of the angle of arrival of the incident electromagnetic field and representative of the total resultant intensity of the field; and (4) means for indicating the output signal. The loops of the antenna are planar, and the planes are orthogonally disposed and intersect to form an axis about which the loops are symmetrically disposed. The indicating means may be a meter or an alarm circuit or both, or other suitable indicating means.

STATEMENT OF THE OBJECTS OF INVENTION

An object of this invention is to indicate, in standard field intensity units, the total resultant vertical electromagnetic field intensity of an incident electromagnetic field which may radiate from one or several sources, independently of frequency and direction, in a frequency range of 2MHz to 32 MHz.

A further object of the invention is to indicate the above-described field intensity with a device which is sturdy, compact, not subject to drift, and is not sensitive to the presence of personnel.

DESCRIPTION OF THE PREFERRED EMBODIMENT

Figure 1:
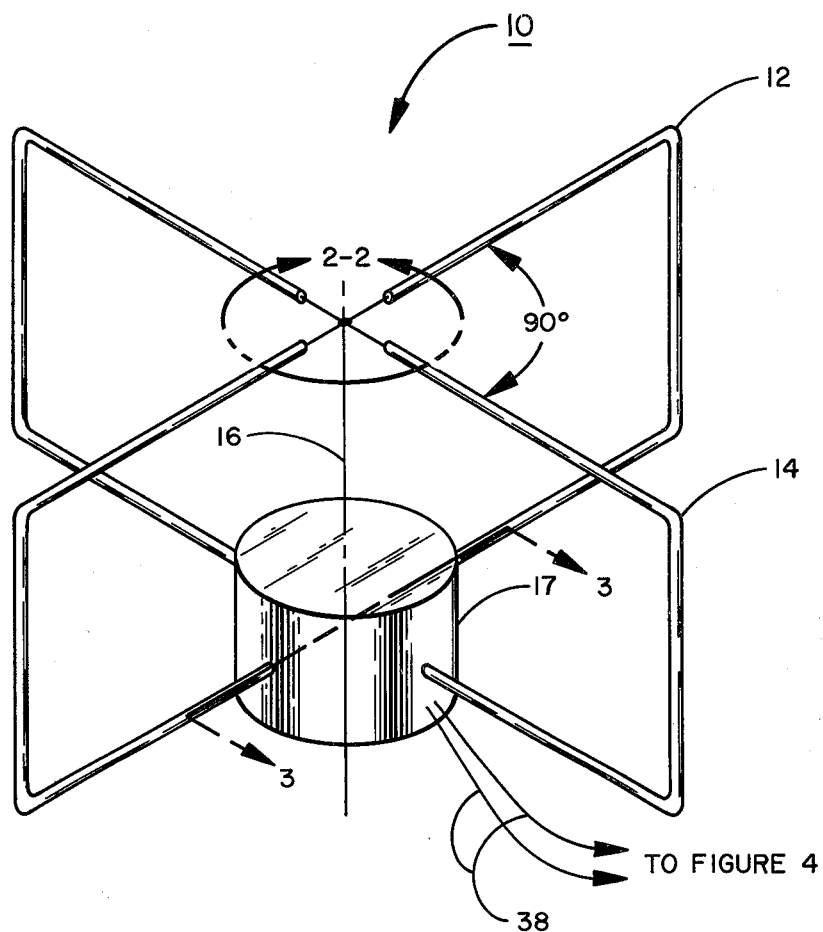
FIG. 1 is a perspective illustration of one embodiment of an antenna and current transformers enclosed within an R.F. shielded box of the device of the invention.

Referring now to FIG. 1, the antenna 10 of the device of the invention has two planar conductive loops 12 and 14. The loops here illustrated are square loops, but they may be any shape, such as circular, which will detect electromagnetic radiation in the 2MHz to 32 MHz range, without departing from the scope of the invention. The planes described by loops 12 and 14 are orthogonally disposed with respect to each other, as illustrated in FIG. 1. In addition, loops 12 and 14 intersect at a common central axis 16 so that the loops are symmetrically disposed about axis 16. This loop arrangement insures that incident vertical electromagnetic fields will be detected omnidirectionally, thereby enabling measurement of the total vertical incident electromagnetic field.

Figure 2:
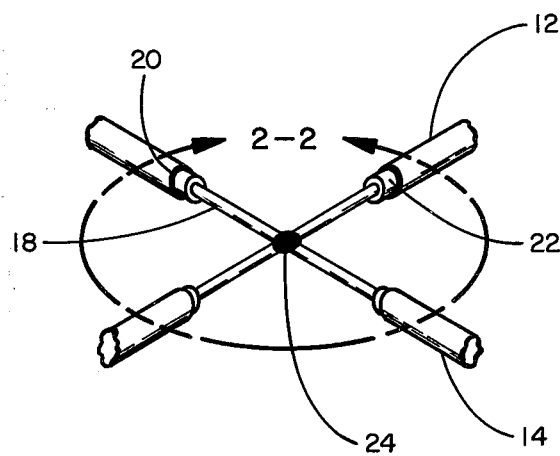
FIG. 2 is an enlarged section of portion 2—2 of FIG. 1 showing a detailed construction of the antenna loops.

Referring to FIG. 2, conductive loop 12 has an inner conductor 18 and outer conductor 20, separated by a dielectric layer 22. In the illustrated embodiment, outer conductor 20 is fabricated from standard copper tubing having a ⅝ inch outside diameter. Outer conducter 20 may have any dimensions and may be made of any rigid material consistent with its use as an antenna loop for the detection of radiation in the 2MHz to 32MHz range. In the illustrated embodimnet, inner conductor 18 is the inner conductor of an RG-9 coaxial cable (Joint Army-Navy specification number) which may be any dimension smaller than that of the inside diameter of outer conductor 20, consistent with its use as an antenna loop and of any material consistent with its use as an antenna loop. Dielectric layer 22 insulates inner conductor 18 from outer conductor 20, centers the inner conductor within the outer conductor, reduces distributed capacitance and may be any commercially-available dielectric material. In the illustrated embodiment, dielectric layer 22 is the dielectric surrounding the inner conductor of an RG-9 coaxial cable. The inner conductor of loop 12 is joined to the inner conductor of loop 14 by a soldered, welded or brazed joint 24. The outer conductors of loops 12 and 14 are not permitted to contact each other electrically in the region of the soldered joint so that an incident electromagnetic field will independently generate a current in each of the loops.

Figure 3:
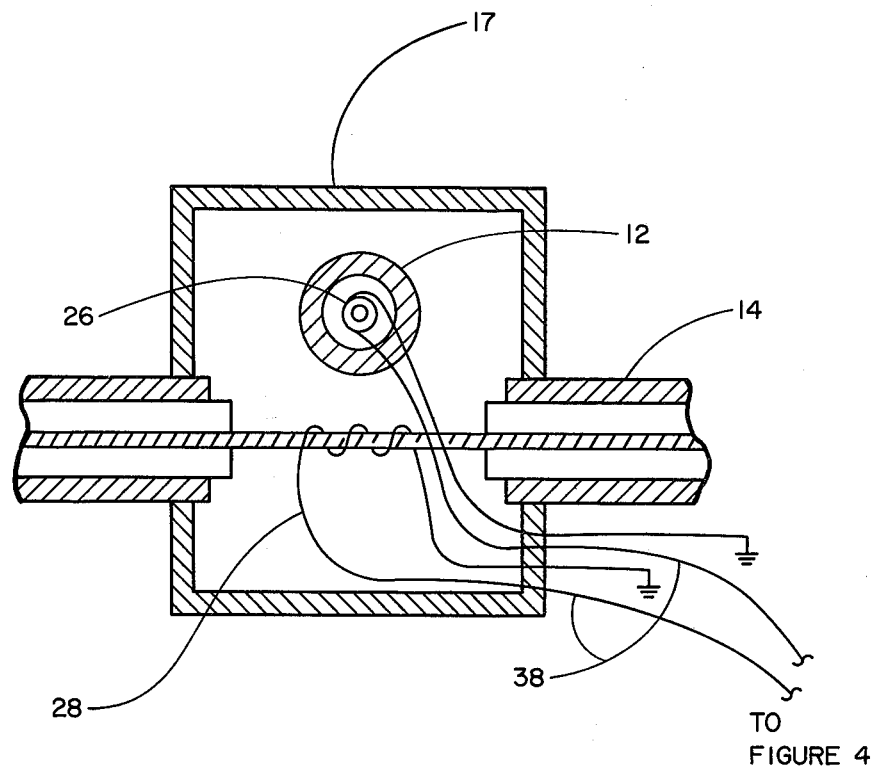
FIG. 3 is an enlarged sectional view taken along sectional line 3—3 of FIG. 1 showing additional detailed construction of the antenna loops.

Referring now to FIG. 3, current transformers 26 and 28 surround the inner conductors of loops 12 and 14 respectively, which cross each other but do not touch. The transformers are contained within an R.F.-shielded, electrically-conductive box 17 and change current induced in the inner conductors of the loops by an incident electromagnetic field into voltage signals proportional to the current. Transformers 26 and 28 may be any standard broadband current probes, such as the Tektronix CT-1, Model P 6040 probes, which give a transfer ratio of about 5 volts per amp.

The outer conductors of loops 12 and 14 must be continuously electrically connected, in the region of current transformers 26 and 28, in order to provide full loop antennas. This electrical connection is accomplished by terminating loops 12 and 14 in conductive box 17, and by providing firm electrical connections to the box by conductive couplings (not shown).

Figure 4:
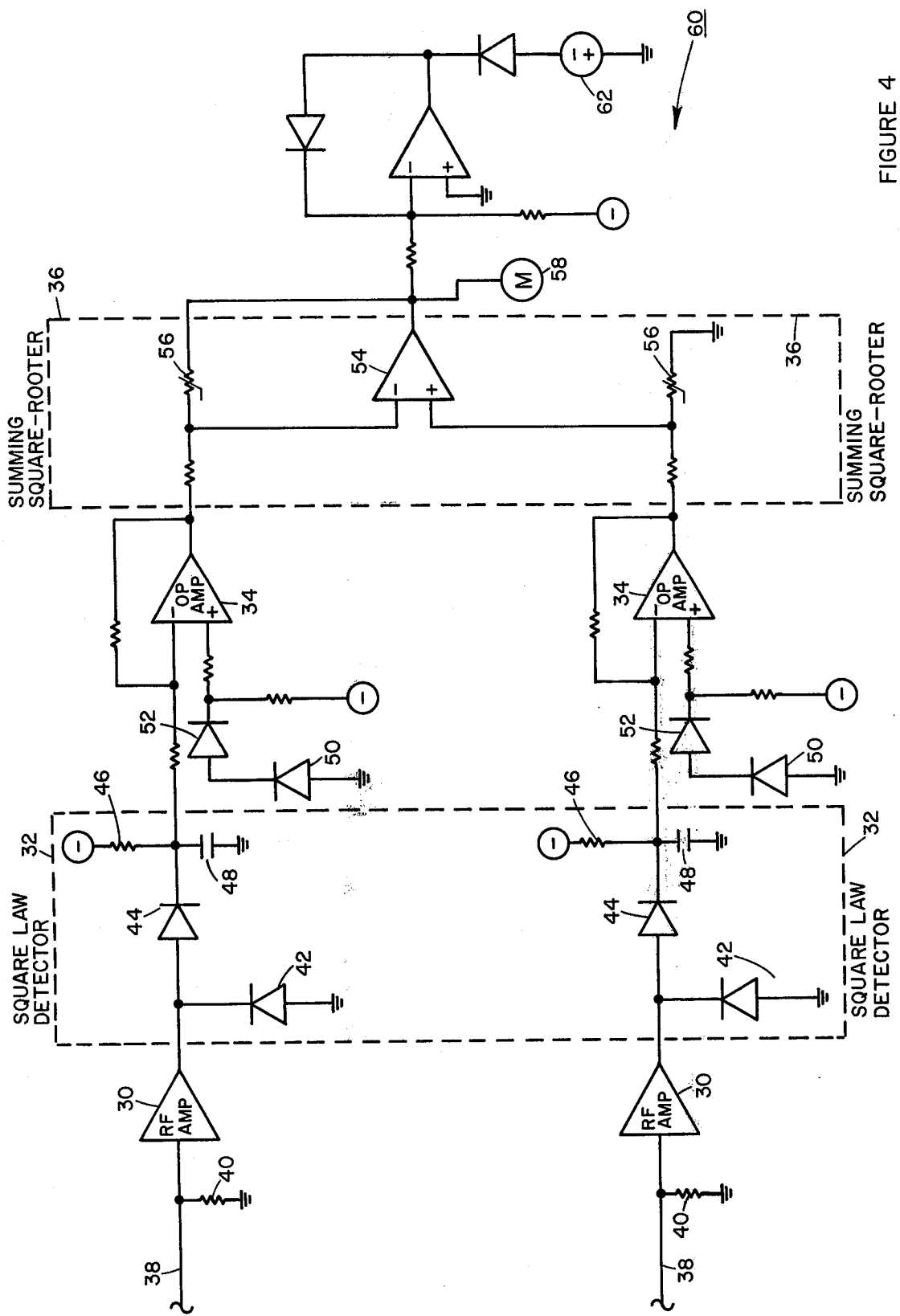
FIG. 4 is a circuit diagram of one embodiment of the means for combining voltage signals to provide an omnidirectional, frequency-independent output signal.

Referring now to FIG. 4, the means for combining the transformer-output voltage signals to provide an output signal independent of the angle of arrival of the incident electromagnetic field and representative of the total resultant intensity of the field in which there are one or more radiating sources includes for each of the two voltage signals, an R.F. amplifier 30, a square law detector 32, an operational amplifier 34 and one summing square-rooter 36. The R.F. amplifiers 30 are connected to the output of the current transformers by fifty ohm lines 38 which are provided with a matched load by termination resistors 40. The gains of amplifiers 30 are adjusted to calibrate the field intensity meter 58 described hereinafter, by injecting a known signal and adjusting the gain for the appropriate meter reading.

Each R.F. amplifier feeds a separate square law detector (enclosed within the dotted box 32 of FIG. 3). Each square law detector 32 has two Schottky barrier diodes 42 and 44 biased at 20 microamps by resistors 46 to operate in the square law region. Filter capacitors 48 filter the R.F. signals to provide a steady D.C. input for operational amplifiers 34. Operational amplifiers 34 amplify the d.c. voltage outputs of the square law detectors. Since the quiescent d.c. voltages are also fed to the operational amplifiers, two other diode pairs 50 and 52 are used to produce a common mode signal at each of the inputs of the operational amplifiers 34. Also, by using matched diodes temperature variations will be cancelled by the common mode rejection properties of the operational amplifiers.

Next, the d.c. signal outputs of operational amplifiers 34 form the input to the summing square-rooter shown in the dotted box indicated 36. Summing square-rooter 36 takes the square root of the sum of output voltage signals of amplifiers 34 using amplifier 54 and non-linear feedback resistors 56. The resulting signal is directly proportional to the total resultant vertical field strength impinging on the antenna and is independent of the frequency and the direction of approach of the impinging field. This signal may then be indicated on an indicating means which may be a D.C. meter 58 and/or may be an alarm circuit 60 which actuates an alarm 62 when the electromagnetic environment exceeds a predetermined level. The indicating means may also be an alarm circuit which responds to increasing field strengths by sounding an alarm at an increasing volume.

Figure 5:
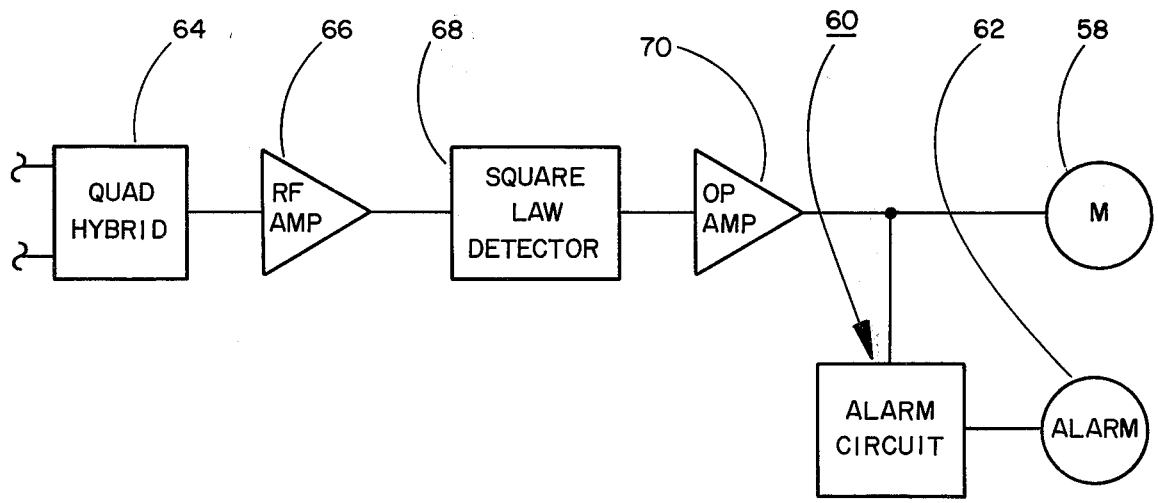
FIG. 5 is a block diagram showing an alternative means for combining voltage signals to provide an omnidirectional, frequency-independent output signal.

The means by which the transformer-output voltages are combined to provide an output signal independent of the angle of arrival of the incident electromagnetic field and representative of the total resultant intensity of the field, in the embodiment illustrated in FIG. 5, utilizes a "quad-hybrid." The quad-hybrid enables the elimination of one of the two separate square-law detectors of the embodiment illustrated in FIG. 4, since it is not necessary to sum the two separate detected signals. The quad-hybrid 64 used in the embodiment of FIG. 5 has two input terminals and two output terminals. When voltages of V1 and V2 are impressed on the two input terminals, the output voltages will have the value $$\frac{1}{2}(V_2 - jV_1) \text{ and } \frac{1}{2}(V_1 - jV_2),$$

where $V_1 = V_0 \cos\theta$ $V_2 = V_0 \sin\theta$ and $V_o =$ magnitude of the transformer output voltage when either loop is oriented for maximum response to the given incident field, and $\theta$ is the actual angle of arrival of the field. Thus, the value at either output terminal will be proportional to the sum of the electromagnetic field where current transformers 26 and 28 are connected to the inputs of quad-hybrid 64. This signal is then input to r.f. amplifier 66, then to square-law detector 68 and then to operational amplifier 70, which provides a signal proportional to the squares of the separate electromagnetic radiation sources and is thus representative of the total resultant vertical electromagnetic field incident on the antenna. The quad-hybrid is commercially available from Anzac Electronics and is model number JH-6-4. The resulting output from the operational amplifier 70 is then applied to an indicating means which may be, similarly to the embodiment of FIG. 4, a d.c. meter 58 and/or an alarm circuit 60 to actuate an alarm 62.

Thus, a device has been provided which indicates the intensity of the total resultant vertical electromagnetic field independently of the direction of arrival and the frequency of the field within a frequency range of 2 MHz to 32 MHz.

What is claimed is:

1. A broadband omnidirectional electromagnetic-field intensity indicating device operating in the 2 MHz to 32 MHz frequency range comprising:

an antenna having two planar conductive loops, the planes of said loops being orthogonally disposed, and said planes intersecting to form an axis about which the loops are symmetrically disposed, wherein an incident electromagnetic field will generate a current in each of the loops;

two current transformers, one connected to each of the loops to convert the current therein to proportional voltage signals;

a square law detector;

a summing square rooter, said square law detector and said summing square rooter combining the voltage signals to provide an output signal independent of the angle of arrival of and the frequency of the incident electromagnetic field, and representative of the total resultant intensity of the field; and, means for indicating the output signal.

2. A broadband omnidirectional electromagnetic-field intensity indicating device operating in the 2 MHz to 32 MHz frequency range comprising:

an antenna having two planar conductive loops, the planes of said loops being orthogonally disposed, and said planes intersecting to form an axis about which the loops are symmetrically disposed, wherein an incident electromagnetic field will generate a current in each of the loops;

two current transformers, one connected to each of the loops to convert the current therein to proportional voltage signals;

a quad-hybrid wherein the voltage signals are combined to provide an output signal independent of the angle of arrival of and the frequency of the incident electromagnetic field, and representative of the total resultant intensity of the field; and, means for indicating the output signal.

* * * * *